United States Patent [19]

Martiny

[11] Patent Number: 4,977,336

[45] Date of Patent: Dec. 11, 1990

[54] SCHMITT-TRIGGER CIRCUIT HAVING NO DISCRETE RESISTOR

[75] Inventor: Ingo A. Martiny, Hamburg, Fed. Rep. of Germany

[73] Assignee: U.S. Philips Corporation, New York, N.Y.

[21] Appl. No.: 328,378

[22] Filed: Mar. 23, 1989

[30] Foreign Application Priority Data

Mar. 25, 1988 [DE] Fed. Rep. of Germany ....... 3810058

[51] Int. Cl.[5] ............................ H03K 3/29; G05F 3/16
[52] U.S. Cl. ................................... 307/290; 307/292; 323/315; 323/316
[58] Field of Search ................ 307/290, 292; 323/315, 323/316

[56] References Cited

FOREIGN PATENT DOCUMENTS 0198021 11/1984 Japan .................................. 307/290
0136413 7/1985 Japan .

*Primary Examiner*—Stanley D. Miller
*Assistant Examiner*—Trong Phan
*Attorney, Agent, or Firm*—Jack D. Slobod

[57] ABSTRACT

A Schmitt-trigger circuit includes a differential amplifier (1), formed of at least two transistors (2, 3) having their emitters coupled to at least a first current source (4). The differential amplifier (1) has a first input for receiving an input signal (Ue) and has one output coupled, via a first current mirror (5) and a feedback transistor (8), to the second input, from which output an output signal is taken. The second input of the differential amplifier (1) is coupled to a second current source (9) as well as to a diode array which comprises at least two diode elements (10, 11) and which is arranged in parallel with the first current mirror (5) and the feedback transistor (8).

9 Claims, 2 Drawing Sheets

SCHMITT-TRIGGER CIRCUIT HAVING NO DISCRETE RESISTOR

BACKGROUND OF THE INVENTION

1. Field of the Invention

The invention relates to a Schmitt-trigger circuit for converting an input signal on an input terminal into an output signal on an output terminal, which circuit comprises a differential amplifier comprising a first transistor and a second transistor, each having a base, an emitter and a collector, the emitters of the first and the second transistor being coupled to a first current source, the base of the first transistor being coupled to the input terminal, the collector of the second transistor being coupled to an input of a first current mirror, and the base of the second transistor being coupled to an output of the first current mirror.

2. Description of the Prior Art

A Schmitt-trigger circuit comprising two emitter-coupled transistors is known from Japanese Kokai No. 60-136413(A). The input voltage is applied to the base of one transistor (first input). The second input, i.e. the base of the second transistor, is connected to the collector of the second transistor by a current mirror. The first and second transistor have their emitters connected to a current source.

The known Schmitt-trigger circuit cannot readily be fabricated in integrated circuit technology, because resistors, in particular those having high values, are difficult to integrate.

SUMMARY OF THE INVENTION

It is an object of the invention to provide a Schmitt-trigger circuit which does not employ any resistors.

In a Schmitt-trigger circuit of the type defined in the opening paragraph this object is achieved in that at a first coupling point the base of the second transistor is coupled to a second current source, and at a second coupling point to the output of the first current mirror via a semiconductor junction and to a first diode array, which diode array comprises at least two diode elements and is arranged in parallel with the first current mirror and the semiconductor junction.

In this Schmitt-trigger circuit a current will flow into the first current source via the input stage of the first current mirror and the differential amplifier if the input signal is small enough. The current reproduced by the first current mirror flows from the output stage of this current mirror into the second current source via the semiconductor junction. No current will flow into the first diode array because the voltage across the current-mirror output and the semiconductor junction is smaller than two diode voltages. If the input signal is large enough there will be no current in the first current mirror and the semiconductor junction. The current which flows into the second current source is supplied by the first diode array.

If the semiconductor junction is a base-emitter junction of a feedback transistor which has its base coupled to the output of the first current mirror and its emitter to the base of the second transistor, the current gain from the output of the first current mirror to the base of the second transistor will be higher, which causes the trigger circuit to change over more rapidly.

The output signal can be derived by means of, for example, a further current mirror coupled to the first diode array. The output signal changes from a low to a high level at a first threshold, which depends upon the voltage of the output stage of the first current mirror and the base-emitter voltage of the feedback transistor. The second switching threshold, at which a change from a high to a low level takes place, depends upon the sum of the forward voltages of the diode elements in the first diode array.

The first diode array should comprise at least two series-connected diode elements. The diode elements are poled in the forward direction for the current which flows to the second current source.

The hysteresis width, i.e. the spacing between the two switching thresholds, is dictated by the number of diode elements in the first diode array. The switching thresholds can be reduced, while maintaining their spacing, in that a second diode array is arranged between the first and the second coupling point.

Preferably, the output signal is taken from the first diode array by means of a current mirror. The first diode array is then arranged in the input-current path of an input stage of a second current mirror having an output stage connected to the output terminal.

In the currentless state temperature variations or crystal defects may give rise to a leakage current in the output stage of the first current mirror. In order to drain (absorb) this leakage current the collector of the first transistor is connected to an input of a third current mirror which has an output coupled to an input of a fourth current mirror having an output connected to the base of the feedback transistor. The leakage current is then drained by the output stage of the fourth current mirror. Moreover, the loop gain is increased, which improves the edge steepness of the output signal at the upper switching thresholds.

In order to prevent the first transistor of the differential amplifier from being driven into saturation for high input voltages the input terminal is coupled to the base of the first transistor via an input diode array.

In a further embodiment of the invention the input of the first current mirror is preceded by an input stage of a fifth current mirror, which has an output stage coupled to to an input stage of a sixth current mirror having an output stage connected to the output terminal. This embodiment may be used to drain the leakage current of the output stage of the second current mirror in the currentless state. The output stages of the second and the sixth current mirror are then interconnected.

Said further embodiment may also serve to apply the output signal to a circuit in I$^2$L-technology. The second current mirror can then be dispensed with and the first and the second current source each form an output stage of a current-source array which is constructed in I$^2$L technology and which comprises transistors whose bases are connected to a common injector or control means.

Embodiments of the invention will now be described in more detail, by way of example, with reference to the accompanying drawings. In the drawings:

DETAILED DESCRIPTION OF THE PREFERRED EMBODIMENTS

Figure 1:
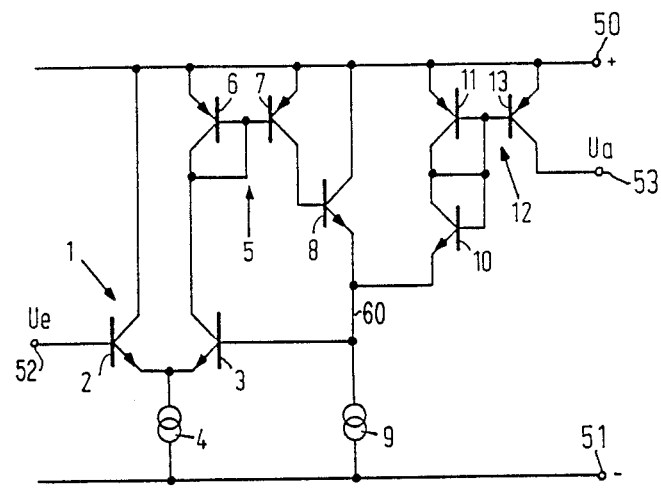
FIG. 1 is a simplified circuit diagram of a Schmitt-trigger circuit.

The Schmitt-trigger circuit whose simplified circuit diagram is shown in FIG. 1 comprises a differential amplifier 1 comprising two NPN transistors 2 and 3, whose emitters are connected to a current source 4. The other terminal of the current source 4 is connected to the negative supply-voltage terminal of a voltage source (not shown). The collector of the transistor 2 is connected to the positive supply-voltage terminal 50 of the voltage source, and an input voltage Ue on the input terminal 52 is applied to the base of the transistor 2. The collector of the transistor 3 is connected to the input stage of a first current mirror 5. The input stage comprises a PNP transistor 6, which has its emitter connected to the positive supply-voltage terminal 50 and which has its base and its collector connected to the collector of the transistor 3. The output stage of the current mirror 5 is formed by a transistor 7 whose base is connected to the base of the transistor 6 and whose emitter is also connected to the positive supply-voltage terminal 50. The collector of the transistor 7 is connected to the base of an NPN-type feedback transistor 8 whose collector is connected to the positive supply-voltage terminal 50 and whose emitter is connected to the emitter of an NPN transistor 10 connected as a diode element and via a coupling means 60 comprising a conductor to a second current source 9 and to the base of the transistor 3 the emitter of an NPN transistor 10 connected as a diode element. The other terminal of the current source 9 is connected to the negative supply-voltage terminal 51. The base and the collector of the transistor 10 are connected to the collector and the base of a PNP transistor 11, which constitutes the input stage of a second current mirror 12. The emitter of the transistor 11 as well as the emitter of a PNP transistor 13 are connected to the positive supply-voltage terminal 50. The base of the transistor 13 is connected to the base of the transistor 11. The collector of the transistor 13 constitutes the output 53 of the Schmitt-trigger circuit.

Figure 2:
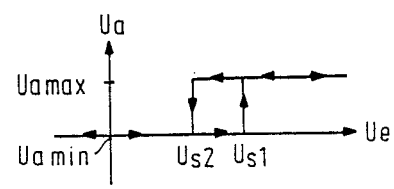
FIG. 2 shows the transfer characteristic of the Schmitt-trigger circuit.

The operation of the Schmitt-trigger circuit will now be explained by means of the transfer characteristic shown in FIG. 2. When the input signal Ue is negative the transistor 2 is cut off and the transistor 3 is conductive. A current flows into the current source 4 via the transistor 6 of the current mirror 5 and the collector-emitter junction of the transistor 3. The conductive feedback transistor 8 feeds a substantially equal current to the current source 9. The transistor 7 in the output stage of the current mirror 5 is saturated. Since the transistor 8 is conductive the diode junctions of the two transistors 10 and 11, which are connected as diode elements, are short-circuited. As a result of this, the current mirror 12 is in a currentless state and the output voltage Ua min supplied to the output is approximately zero relative to the negative supply voltage terminal 51.

The output voltage Ua changes from a low level Ua min to a high level Ua max when the input voltage is equal to Us1. The transistor 3 is then turned off and the transistor 2 is turned on. No current flows via the current mirror 5 and the transistor 8 is cut off. The current source 9 draws its current via conductor 60 from the current mirror 12 and the transistor 10. Now the output voltage is equal to the product of the current from the current source 9 and a load resistance, not shown. The output voltage Ua changes from a high level Ua max to a low level Ua min at a switching threshold Us2. The switching threshold Us1 is higher than the switching threshold Us2. The switching threshold Us1 is determined by the satuartion voltage of the transistor 7 and the base-emitter voltage of the transistor 8. The switching threshold Us1 complies with the following equation:

$$Us1 = Up - Usat7 - Ube8,$$

where Up is the voltage on the supply-voltage terminal 50, Usat7 is the saturation voltage of the transistor 7, and Ube8 is the base-emitter voltage of the transistor 8.

The switching threshold Us2 is dictated by the base-emitter voltages of the transistors 10 and 11. The switching threshold Us2 complies with the following equation:

$$Us2 = Up - Ube10 - Ube11,$$

where Ube10 is the base-emitter voltage of the transistor 10 and Ube11 is the base-emitter voltage of the transistor 11.

The spacing between the two switching thresholds Us1 and Us2 can be increased by means of further transistors arranged as diode elements. The transistors arranged as diode elements must be connected in series with the transistor 10. The position of the switching hysteresis can also be changed by means of further transistors connected as diode elements. The spacing between the two switching thresholds then remains the same. The transistors connected as diode elements should be arranged between the junction point between the emitters of the transistors 8 and 10 and the junction point between the base of the transistor 3 and the current source 9.

Figure 3:
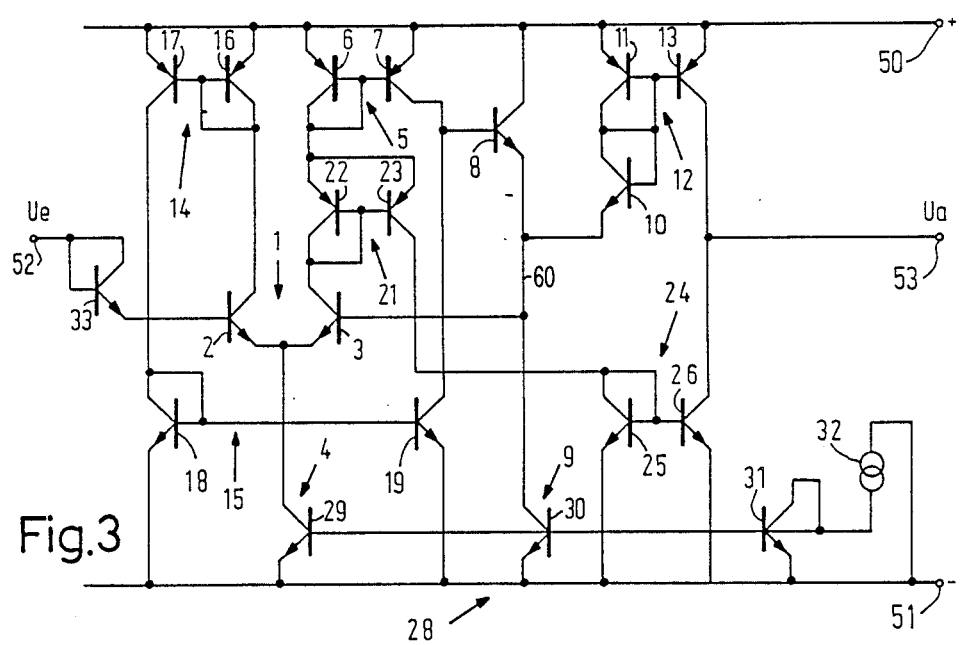
FIGS. 3 and 4 show more detailed circuit diagrams of embodiments of the Schmitt-trigger circuit.

In the off-state of the transistor 3, when the current mirror 5 should be currentless, crystal defects or temperature changes may give rise to leakage currents from the transistor 7. The output stage of the second current mirror 12 may also produce a leakage current. In comparison with the embodiment shown in FIG. 1 the embodiment shown in FIG. 3 comprises some additional current mirrors, which ensure that the leakage currents are absorbed. The collector of the transistor 2 is connected to the input stage of a third current mirror 14, whose output stage is coupled to a fourth current mirror 15. The input stage of the current mirror 14 comprises a PNP transistor 16 having its emitter connected to the positive supply-voltage terminal and having its base and its collector connected to the collector of the transistor 2. The PNP transistor 17, which constitutes the output stage of the current mirror 14, also has its emitter connected to the positive supply-voltage terminal and its base to the base of the transistor 16. The collector of the transistor 17 constitutes the output of the current mirror 14. This output is connected to the base and the collector of an NPN transistor 18, which constitutes the input stage of the current mirror 15. The emitter of the transistor 18 is connected to the negative supply-voltage terminal. The output stage of the current mirror 15 is constituted by an NPN transistor 19 having its collector coupled to the base of the feedback transistor 8 and to the collector of the transistor 7. The emitter is connected to the negative supply-voltage terminal and the base of the transistor 19 is connected to the base of the transistor 18. A leakage current supplied by the collector of the transistor 7 is drained by the transistor 19. In addition, the third and the fourth current mirror provide a higher loop gain and hence steeper edges of the output signal obtained at the switching threshold Us1.

A fifth current mirror 21 is arranged between the collector of the transistor 3 and the input stage of the first current mirror 5 and comprises the PNP transistors 22 and 23. The base of the transistor 22 and the base of the transistor 23 are connected to the collector of the transistor 3 and the collector of the transistor 22. The emitters of the two transistors are connected to the base of the transistor 6. The collector of the transistor 23 is connected to the input stage of a sixth current mirror 24. The input stage of this current mirror comprises an NPN transistor 25 which has its emitter connected to the negative supply-voltage terminal and its base and collector to the collector of the transistor 23. The output stage of the sixth current mirror 24 is constituted by an NPN transistor 26 whose collector together with the collector of the transistor 13 constitutes the output. The emitter is also connected to the negative supply-voltage terminal and the base to the base of the transistor 25. The transistor 26 drains the leakage current produced by the collector of the transistor 13 when this transistor should be in a currentless state.

The current sources 4 and 9 are formed by the output stages of a current-source array 28. The two output stages each comprises an NPN transistor 29 and 30 respectively, whose emitters are connected to the negative supply-voltage terminal and whose bases are connected to the base of an NPN transistor 31. The collector of the transistor 29 is connected to the emitters of the transistors 2 and 3 and the collector of the transistor 30 is connected to the base of the transistor 3. The emitter of the transistor 31 is also connected to the negative supply-voltage terminal and the collector of the transistor 31 is connected to its base and to a further current source 32. The other terminal of the current source is connected to the negative supply-voltage terminal.

In order to prevent the transistor 2 of the differential amplifier 1 from being saturated for high input voltages, a transistor 33 arranged as a diode element is connected to the base of the transistor 2. The input signal Ue is applied to the base and to the collector of the transistor 33, whose emitter is connected to the base of the transistor 2. As a result of this, the two switching thresholds Us1 and Us2 are, each time shifted by one base-emitter voltage.

Figure 4:
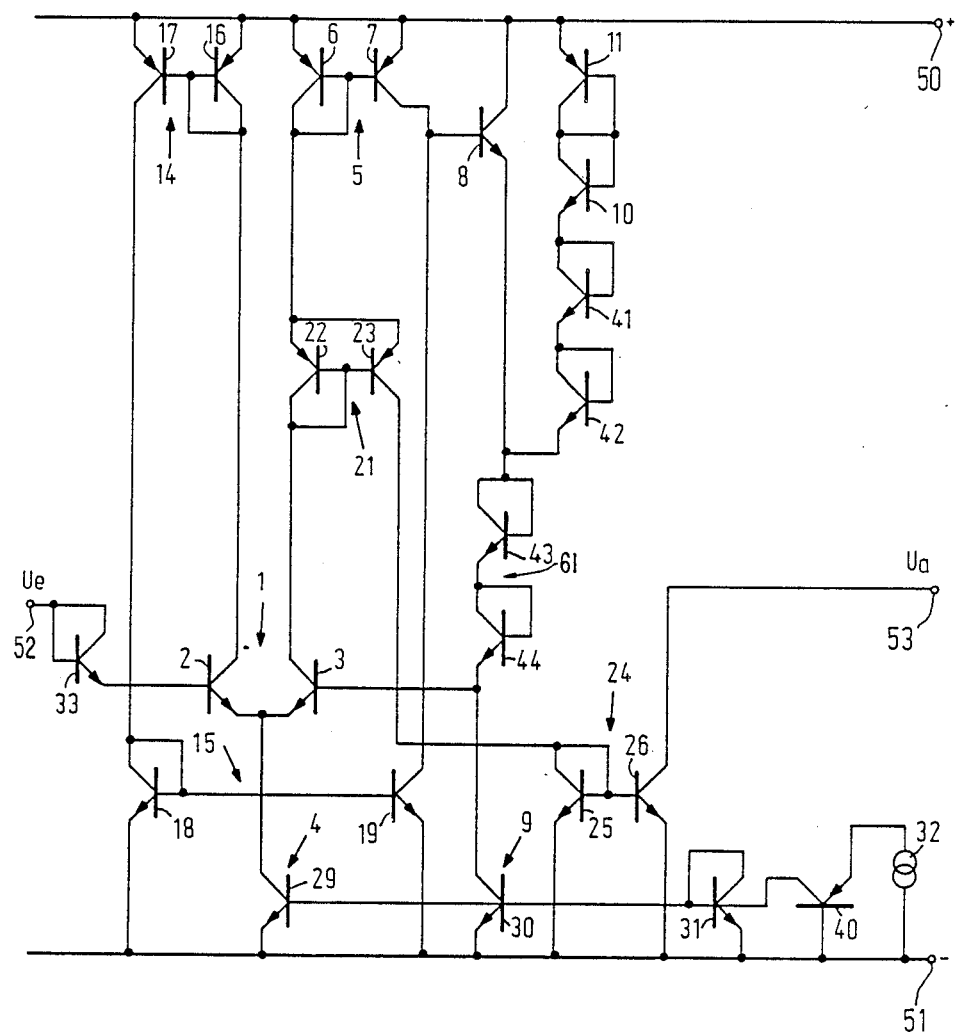

The Schmitt-trigger circuit can also be used in an I²L circuit. FIG. 4 shows an embodiment suitable for this purpose. This embodiment differs from that shown in FIG. 3 in that the transistor 13 is dispensed with and an injector or control means comprising a PNP transistor 40 operating in common-base arrangement supplies base currents to the current source array 28. The transistor 40 has its collector connected to the base of the transistor 31 and its emitter to the current source 32. The base of the transistor 40 is connected to earth. The output of the circuit arrangement is constituted by the collector of the transistor 26.

The switching thresholds Us1 and Us2 in the present embodiment have also changed because further diode-element transistors are arranged between the emitter connection of the transistor 8 and the base connection of the transistor 3 and between the the emitter connection of the transistor 8 and the emitter connection of the transistor 10. An NPN transistor 41 has its collector and its base connected to the emitter of the transistor 10 and has its emitter connected to the base and the collector of a further NPN transistor 42. The emitter of the transistor 42 is connected to the emitter of the transistor 8 and, via a coupling means 61 comprising the series combination of further NPN transistors 43 and 44 connected as diodes, to the base of transistor 3 and to current source 9. An upper end of coupling means 61 comprises the commoned emitter of the transistor 43 is connected to the base and the collector of an NPN transistor 44, which has its emitter connected to the base of the transistor 3 and to the collector of the transistor 30. The switching threshold Us1 satisfies the following equation:

$$Us1 = Up - Usat7 - Ube8 - Ube43 - Ube44 + Ube33,$$

and the switching threshold Us2 complies with the equation:

$$Us2 = Up - Ube11 - Ube10 - Ube41 - Ube43 - Ube44 + Ube33,$$

where Ube33, Ube41, Ube42, Ube43 and Ube44 are the base-emitter voltages of the transistors 33, 41, 42, 43 and 44.

I claim:

1. A Schmitt-trigger circuit comprising:
an input terminal (52);
a first current source (4);
a second current source (9);
a first current mirror (5) having an input and an output;
a coupling means;
a differential amplifier comprising a first transistor (2) and a second transistor (3), each having a base, an emitter and a collector, the emitters of the first and the second transistors being coupled to the first current source (4), the base of the first transistor being coupled to the input terminal, the collector of the second transistor being coupled to the input of the first current mirror (5), and the base of the second transistor being coupled to the output of the first current mirror, characterized in that the coupling means is coupled to the base of the second transistor, to the second current source (9), to the output of the first current mirror via a semiconductor junction (8), and to a first diode array (10, 11), which diode array comprises at least two diode elements in a first current-path which is arranged in parallel with a second current-path comprising the output of the first current mirror and the semiconductor junction.

2. A Schmitt-trigger circuit as claimed in claim 1, characterized in that the semiconductor junction is a base-emitter junction of a feedback transistor (8) which has its emitter coupled to the coupling means.

3. A Schmitt-trigger circuit as claimed in claim 1, characterized in that said coupling means comprises a second diode array (43,44).

4. A Schmitt-trigger circuit as claimed in claim 1, further comprising an output terminal and wherein the first diode array comprises an input of a second current mirror (12), said second current mirror having its output coupled to the output terminal.

5. A Schmitt-trigger circuit as claimed in claim 4, further comprising third and fourth current mirrors each having an input and an output and wherein the collector of the first transistor (2) is coupled to the input of said third current mirror (14), the output of said third current mirror is coupled to the input of said fourth current mirror (15), and the output of said fourth current mirror is coupled to the base of the feedback transistor (8).

6. A Schmitt-trigger circuit as claimed in claim 5, characterized in that the input terminal (52) is coupled to the base of the first transistor (2) via a second diode array (33).

7. A Schmitt-trigger circuit as claimed in claim 5, further comprising fifth and sixth current mirrors each having an input and an output and wherein the input of the first current mirror (5) is in series with the input of said fifth current mirror (21), the output of said fifth current mirror is connected in series with the input of said sixth current mirror (24), and the output of said sixth current mirror is coupled to the output terminal (53).

8. A Schmitt-trigger circuit as claimed in claim 7, wherein the outputs of the second and sixth current mirrors are in series with each other.

9. A Schmitt-trigger circuit as claimed in claim 8, wherein the first and second current sources (4, 9) respectively comprise first and second outputs of a controllable current-source array which is constructed in I$^2$L Technology and which comprises a common control means (40, 32, 31).

* * * * *